United States Patent [19]
Wennekers

[11] Patent Number: 5,739,561
[45] Date of Patent: Apr. 14, 1998

[54] LIGHT SENSITIVE SEMICONDUCTOR DEVICE AND METHOD OF OPERATION

[75] Inventor: Peter Wennekers, Tempe, Ariz.

[73] Assignee: Motorola, Inc., Schaumburg, Ill.

[21] Appl. No.: 640,222

[22] Filed: Apr. 30, 1996

[51] Int. Cl.$^6$ ............................................. H01L 29/80
[52] U.S. Cl. ........................... 257/257; 257/280; 257/453; 257/462
[58] Field of Search .................... 257/257, 280, 257/281, 282, 462, 453, 449

[56] References Cited

U.S. PATENT DOCUMENTS 5,196,717  3/1993  Hiroki et al. ........................... 257/257
5,431,883  7/1995  Barraud ................................. 257/254

Primary Examiner—Minh-Loan Tran
Attorney, Agent, or Firm—Daniel R. Collopy; Vincent B. Ingrassia

[57]  ABSTRACT

A light sensitive semiconductor device (10) is formed in a well region (12) in a semiconductor substrate (11). A first voltage (30) is applied to a source region (4) of the semiconductor device (10) and to a contact region (13) to the well region (12) to attract holes. A second voltage (31) is applied to the source region (14) and a drain region (16) to provide a current flow. As photons (23) from a light source are absorbed by semiconductor device (10), the source to drain current is decreased.

21 Claims, 1 Drawing Sheet

1

LIGHT SENSITIVE SEMICONDUCTOR DEVICE AND METHOD OF OPERATION

BACKGROUND OF THE INVENTION

The present invention relates, in general, to photo-sensing devices, and more particularly to photo-sensing devices formed in a compound semiconductor substrate.

Photo-sensing devices are devices that are capable of detecting or measuring the intensity of a light source by detecting the number of electron-hole pairs that are generated when the device absorbs a photon from the light source. In accordance with Einstein's Principle, the absorption of a photon from a light source results in the generation of an electron-hole pair. The intensity of a light source is quantified by determining the number of holes or electrons generated. In general, these devices are configured such that they use a current flow as a means of communicating the intensity of light that the device is detecting.

One such device is known as a Metal-Semiconductor-Metal (MSM) diode chain. A plurality of metal conductors are arranged on the surface of a semiconductor substrate such that every other conductor is tied to a first potential and the adjacent conductors are tied to a second potential. The two potentials form a sequence of Schottky diodes, which are used to attract the holes and electrons, respectively, of each electron-hole pair that is created as photons are absorbed from the light source. However, because MSM diodes can be dominated by the surface state of the semiconductor substrate, it is difficult to form devices that are both accurate and have a high gain values or collection efficiency.

Another previously known device is referred to as a photo-field effect transistor (FET). Photo-FETs are similar to traditional field effect transistors in that they have a source region, a drain region, and a channel region that is modulated by a gate structure. The channel region is formed to have a depletion region such that the photo-FET operates as a depletion mode device. In addition, the photo-FET requires a first voltage source that is connected between the source and drain regions and a second voltage source that is connected between the source and gate structure with a resistor in series. Photons from a light source will generate holes in the channel region that are subsequently attracted to the second voltage source through the gate structure. As the holes pass through the resistor, the voltage potential on the gate structure will decrease to further reduce the depletion region in the channel region. This will result in a larger current passing from the source region to the drain region.

The only holes that are attracted to the second voltage source are those that are generated in close proximity to or within the depletion region in the channel region. As a result, photo-FETs are sensitive to light in a relatively small region; only the area directly under the gate structure. This reduces the collection efficiency and sensitivity of the photo-FET. To improve the sensitivity of the photo-FET, the resistor value can be increased. However, this only introduces the process restraints and expense that are common to forming resistors with high resistance values and hinders the frequency response of the photo-FET.

By now it should be appreciated that it would be advantageous to provide a photo-sensitive structure that had improved collection efficiency. It would also be advantageous if the structure was not dominated by the surface condition of substrate and did not require the formation of an additional resistor.

DETAILED DESCRIPTION OF THE DRAWINGS

The present invention provides a light sensitive device and a method of operating the same. The device of the present invention comprises a field effect transistor that is formed in a well region in a semiconductor substrate. The presence of the well region results a depletion region in the well region that encircles the FET. This depletion region is much larger than the depletion region formed in the channel region of the previously known depletion mode photo-FET. As a result, the light sensing device of the present invention has an improved collection efficiency. In addition, since the depletion region of the present invention extends further into the semiconductor substrate, the present invention is not dominated by the surface charge or the surface state of the semiconductor substrate.

The present invention further comprises a contact region formed in the well region which is used to improve and adjust the gain of the light sensing device. A voltage source is placed between the contact region and the source region of the FET to attract holes out of the depletion region. The resulting hole current increases the potential difference between channel 17 of semiconductor device 10 and well region 12, thus narrowing channel region 17. This will increase the voltage on the gate structure of the FET and decrease the current passing through the FET. Therefore, as the light intensity on the FET is increased, the current passing through the device is proportionately decreased. A further description of the components and operation of the light sensing device is provided below.

Figure 1:
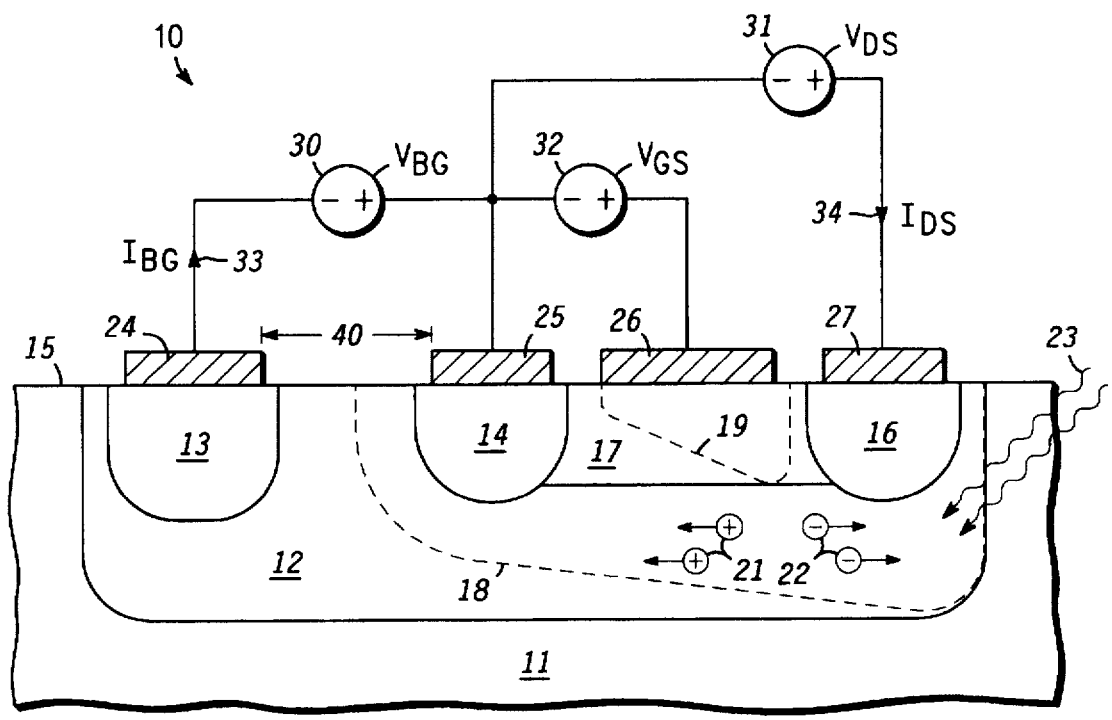
FIG. 1 is an enlarged cross-sectional view of a photo-sensitive device in accordance with the present invention.

Turning now to FIG. 1, a detailed description of the present invention is provided. FIG. 1 is an enlarged cross-sectional view of a photo-sensitive device or semiconductor device 10. Semiconductor device 10 is formed in a semiconductor substrate 11 that is preferably formed from a III-V or II-IV compound semiconductor such as gallium arsenide, indium phosphide, or the like. Substrate 11 could also be a silicon substrate. Semiconductor device 10 comprises a first doped region, which acts as a source region 14, a second doped region, which acts as a drain region 16, a third doped region, which acts as a channel region 17, and a fourth doped region 13, which acts as a contact region 13 to a well region 12.

Source region 14, channel region 17, and drain region 16 are of a first conductivity such as n-type, and well region 12 and contact region 13 are of a second conductivity such as p-type. As a result, a first depletion region 18 is formed as shown in FIG. 1. The gate structure comprises a Schottky contact 26, which is formed with a metallic contact to channel region 17. A second depletion region 19 is formed in channel region 17 due to the presence of a voltage placed on the gate structure overlying channel region 17. A first ohmic contact 25 is used to electrically couple to source region 14, a second ohmic contact 27 is used to electrically couple to drain region 16, and a third ohmic contact 24 is used to electrically couple to contact region 13.

A method of detecting light using semiconductor device 10 is now provided. A first voltage 30 (labeled $V_{BG}$ in FIG.

1) is coupled between contact region 13 and source region 14 such that source region 14 is at a higher voltage or higher potential than contact region 13. Preferably, first voltage 30 is about 1 volt to 10 volts. A second voltage 31 (labeled $V_{DS}$ in FIG. 1) is coupled between source region 14 and drain region 16 such that drain region 16 is at a higher voltage or higher potential than source region 14. Preferably, second voltage 31 is about 0.5 volts to 5 volts. A third voltage 32 (labeled $V_{GS}$ in FIG. 1) is coupled between source region 14 and channel region 17 such that source region 14 is preferably at a different voltage than channel region 17. Preferably, third voltage 32 is about -3 volt to 0.8 volts. It should be understood that the use of third voltage 32 is considered option and such an embodiment will be described below. The appropriate electrical connections necessary to apply first voltage 30, second voltage 31, and third voltage 32 can be performed using the appropriate ohmic contact 24, 25, or 27 or Schottky contact 26.

With the above mentioned voltage biases applied, a current flow labeled $I_{DS}$ and indicated with an arrow 34 will be flowing. Even if semiconductor device 10 is placed in a perfectly dark ambient, current $I_{DS}$ will be flowing and controlled by third voltage 32. When photons are absorbed by substrate 11, in particular when photons 23 are absorbed in or within close proximity to depletion region 18, electron-hole pairs will be generated.

Second voltage 31 will attract and remove electrons from first depletion region 18. This flow of electrons is indicated in FIG. 1 by arrows 22. First voltage 30 will attract holes towards contact region 13. This flow of holes is indicated in FIG. 1 by arrows 21 and labeled as $I_{BG}$ as indicated by arrow 33. The flow of holes under channel region 17 and source region 14 will increase the potential of well region 12 in this area. The increase in potential will reduce the size of channel region 17 not covered by the second depletion region 19, which in turn will reduce the current to flow from source region 14 to drain region 16 through channel region 17. Therefore, as the intensity of a light source increase, and thus the number of photons 23, semiconductor device 10 will respond with a proportional decrease in $I_{DS}$ current (arrow 34).

The proportional decrease in $I_{DS}$ current is scaled by a gain factor referred to simply as the gain of semiconductor device 10. If semiconductor device 10 is configured as described above, semiconductor device 10 can have a gain of about 10,000 to 30,000 times the flow of photons 23. An advantage of the present invention is that the gain of semiconductor device 10 can be controlled after the device has been fabricated. First voltage 30 can be adjusted to directly increase or decrease the gain of semiconductor device 10. This obviates the need to make modifications to the manufacturing process in order to adjust its gain. This also gives improved flexibility to the customer or end user of semiconductor device 10 that is not possible with the above mentioned, previously known MSM diode structures.

Another advantage of the present invention is the increase in sensitivity due to the larger collection area of first depletion region 18. The larger depletion region 18 improves the collection efficiency of semiconductor device as photons 23 that are absorbed in channel region 17 or in and near depletion region 18 can be sensed and contribute to the increase in $I_{DS}$ current. The present invention also obviates the need to form a highly resistive resistor between the third voltage potential and the gate structure of semiconductor device 10. Such resistors are common to many depletion mode photo-FETs and increase the manufacturing difficulty and cost of the device. In addition, the removal of the resistor improves the frequency response of semiconductor device 10 compared to some photo-FET devices.

Figure 2:
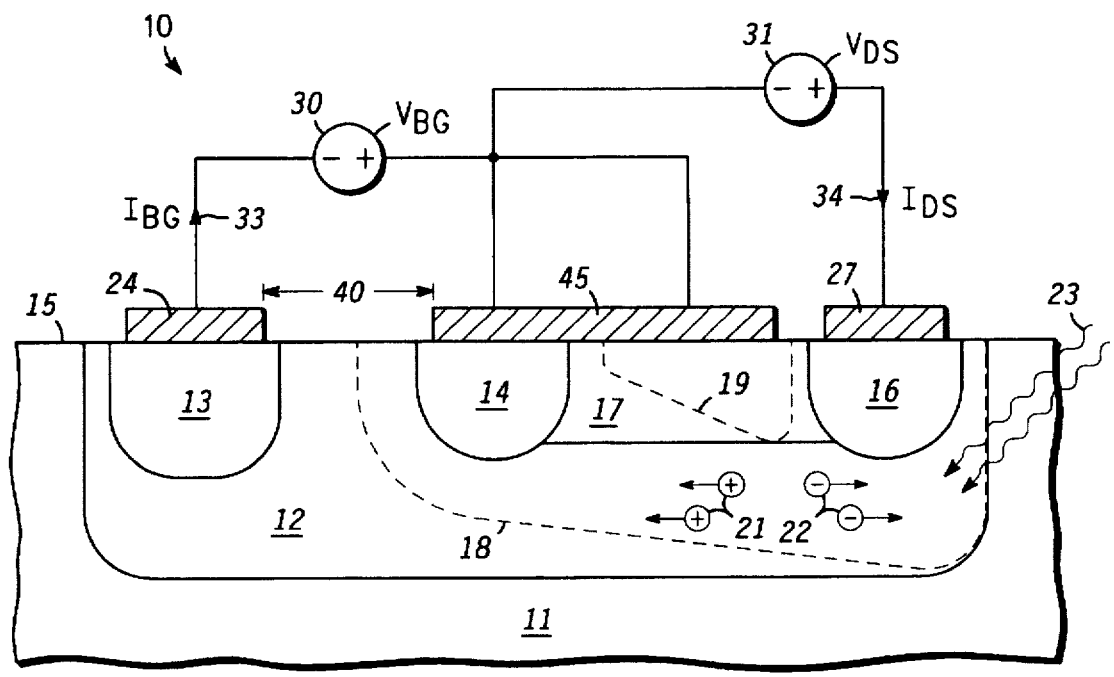
FIG. 2 is an enlarged cross-sectional view of a photo-sensitive device in accordance with an alternate embodiment of the present invention.

Turning now to FIG. 2, an alternate embodiment of the present invention is provided. As mentioned earlier, the use of third voltage 32 is optional. In FIG. 2, this voltage supply is removed and source region 14 is tied to channel region 17 so that they are both biased by first voltage 30 so that are at the same potential. The electrical connection can be accomplished by using the same metal contact, contact 45, to electrically couple to source region 14 and channel region 17. The alternate embodiment achieves similar performance values in both gain and sensitivity when compared to the light sensing device shown in FIG. 1. The embodiment also reduces the number of voltage sources that are required to operate semiconductor device 10.

A method for fabricating semiconductor device 10 will now be provided. In the following narration, well region 12 and contact region 13 are of p-type conductivity and source region 14, channel region 17, and drain region 16 are of n-type conductivity. This is the preferred arrangement if substrate 11 is a silicon or gallium arsenide substrate due to the higher mobility of electrons in silicon and in gallium arsenide compared to the mobility of holes. This orientation is not intended as a limitation and as those skilled in art will appreciate, a p-channel configuration is achieved by converting p-type regions to n-type regions and vice versa. In the example provided below, substrate 11 is a gallium arsenide substrate and it should be understood that the species and dopant concentrations would be changed to form semiconductor device 10 in a silicon substrate.

Referring back now to FIG. 1, the fabrication of semiconductor device 10 begins with the formation of well region 12. A first masking layer (not shown), such as photoresist, is formed on surface 15 of substrate 11 and is patterned to expose the portion of substrate 11 where well region 12 will be formed. Well region 12 is of a first conductivity (p-type) and extends into semiconductor substrate 11 from surface 15. Methods for forming well region 12 are well known in the art. By way of example, substrate 11 is implanted with beryllium with a dose of $2 \times 10^{12}$ to $4 \times 10^{12}$ atoms/cm$^2$ with an energy of about 120 keV to 170 keV. The first masking layer is then removed to allow further processing.

A second masking layer (not shown) is then formed and patterned to expose surface 15 wherein channel region 17 is to be formed. Channel region 17 extends into well region 12 from surface 15 and is formed by implanting semiconductor substrate 11 with silicon using a dose of $2 \times 10^{12}$ atoms/cm$^2$ to $5 \times 10^{12}$ atoms/cm$^2$ with an energy of about 60 keV to 100 keV. The second masking layer is then removed to allow further processing A metal layer (not shown) comprising metals or compounds such as titanium (Ti), titanium tungsten (TiW), titanium tungsten nitride (TiWN), or platinum (Pt) is deposited over the surface 15 of substrate 11 at a thickness of approximately 3000 angstroms to 5000 angstroms. A third masking layer (not shown) is then formed to pattern the metal layer where Schottky contact 26 or contact 45 (see FIG. 2) is to be formed. The exposed portions of the metal layer are removed and the third masking layer is removed to allow further processing.

A fourth masking layer (not shown) is then formed on surface 15 to expose substrate 11 where source region 14 and drain region 16 are to be formed. A variety of dopants such as silicon, selenium, or tellurium can be used to form these regions of a second conductivity. An silicon dose of about $5.0\times10^{12}$ atoms/cm$^2$ to $5.0\times10^{13}$ atoms/cm$^2$ and an implant energy of about 70 keV to 130 keV is suitable to provide n-type source region 14 and drain region 16 such that they extend into well region 12 from surface 15. The fourth masking layer is removed to allow further processing.

A fifth masking layer is the formed on surface 15 to expose the portion of substrate 11 where contact region 13 is formed. The p-type region is formed with a dopant such as beryllium, zinc, or magnesium. A beryllium dose of about $5.0\times10^{14}$ atoms/cm$^2$ to $5.0\times10^{15}$ atoms/cm$^2$ and an implant energy of about 50 keV to 100 keV is suitable to provide contact region 13. Preferably, contact region 13 is position within close proximity to source region 14. As shown in FIG. 1, contact region 13 is within a distance 40 of source region 14. Distance 40 is preferably about 2 microns to 15 microns, however, other dimensions are possible that achieve similar effects. The fifth masking layer is then removed and first ohmic contact 25, second ohmic contact 27, and third ohmic contact 24 are formed using techniques well known in the art to provide a means to electrically couple to source region 14, drain region 16, and contact region 13, respectively.

By now it should be appreciated that the present invention provides a photo-sensing device, and method of operating the same, that has improved performance characteristics over some previously known MSM diode devices or photo-FET devices. The semiconductor device of the present invention is formed in a well region to provide a large depletion region that improves the collection efficiency of the device. The depth of the depletion regions reduces the effects the surface states of the substrate have on the performance of the device. The present invention also obviates the need to form highly resistive resistors to improve the sensitivity or gain of the semiconductor device. Such features reduce the manufacturing cost and improve the performance of the semiconductor device.

I claim:

1. A semiconductor device formed in a semiconductor substrate having a surface, the semiconductor device comprising:
   a well region of a first conductivity disposed in the semiconductor substrate;
   a first doped region of a second conductivity disposed in the well region such that the first doped region extends from the surface;
   a second doped region of the second conductivity disposed in the well region such that the second doped region extends from the surface;
   a third doped region of the second conductivity disposed between the first doped region and the second doped region to provide a channel region;
   a fourth doped region of the first conductivity disposed in the well region such that the fourth doped region extends from the surface and is physically isolated from the first doped region by a first distance;
   a Schottky contact to the third doped region;
   a first ohmic contact to the first doped region;
   a second ohmic contact to the second doped region; and
   a third ohmic contact to the fourth doped region.

2. The semiconductor device of claim 1 wherein the Schottky contact and the first ohmic contact are electrically coupled together such that the Schottky contact and the first ohmic contact are at a same potential.

3. The semiconductor device of claim 1 further comprising a first voltage coupled between the third ohmic contact and the first ohmic contact so that first ohmic contact is at a higher voltage relative to the third ohmic contact.

4. The semiconductor device of claim 3 wherein the first voltage is about 1 volt to 10 volts.

5. The semiconductor device of claim 3 further comprising a second voltage coupled between the second ohmic contact and the first ohmic contact so that second ohmic contact is at a higher voltage relative to the first ohmic contact.

6. The semiconductor device of claim 5 wherein the second voltage is about 0.5 volts to 5 volts.

7. The semiconductor device of claim 5 wherein absorption of a photon by the well region under the third doped region generates a decrease in current flow between the first ohmic contact and the second ohmic contact.

8. The semiconductor device of claim 5 further comprising a third voltage coupled between the Schottky contact and the first ohmic contact so that Schottky contact is at a different voltage relative to the first ohmic contact.

9. The semiconductor device of claim 8 wherein the third voltage is about $-3$ volts to 0.8 volts.

10. The semiconductor device of claim 1 wherein the semiconductor substrate is a gallium arsenide substrate.

11. A method of operating a photo-sensitive device, wherein the photo-sensitive device is formed in a well region in a compound semiconductor substrate and comprises a contact region to the well region, a source region, a drain region, and a channel region between the source region and the drain region, the method comprising the steps of:
    placing a first voltage between the contact region and the source region so that the source region is at a higher potential relative to the contact region;
    placing a second voltage between the source region and the drain region such that the drain region is at a higher potential relative to the source region; and
    generating a decrease in a current flow between the source region and the drain region when a photon is introduced into the compound semiconductor substrate.

12. The method of claim 11 wherein the photo-sensitive device further comprises a first depletion region and the step of generating the decrease in the current flow includes the step of generating an electron-hole pair due to absorption of a photon in the first depletion region.

13. The method of claim 12 wherein the photo-sensitive device further comprises a second depletion region in the channel region and absorption of the photon increases a size of the second depletion region and reduces the current flow from the source region to the drain region.

14. The method of claim 12 wherein the step of placing a first voltage attracts a hole from the electron-hole pair towards the contact region.

15. The method of claim 11 further comprising the step of placing a third voltage between the source region and the channel region such that the channel region is at a different voltage relative to the source region.

16. The method of claim 11 wherein the photo-sensitive device further comprises a Schottky contact to the channel region and an ohmic contact to the source region and the method includes the step of placing a same potential on the Schottky contact and the ohmic contact.

17. A method of detecting light comprising the steps of:
    providing a semiconductor device formed in a well region in a semiconductor substrate, the semiconductor device comprising a contact region to the well region, a source region, a drain region, a channel region disposed between the source region and the drain region, and a first depletion region in the well region and surrounding the source region, the channel region, and the drain region;

placing a first voltage between the contact region and the source region so that the source region is at a higher voltage relative to the contact region;

placing a second voltage between the source region and the drain region such that the drain region is at a higher voltage relative to the source region;

forming a second depletion region in the channel region that modulates a current flow between the source region and the drain region; and absorbing a photon in the first depletion region that decreases the current flow between the source region and the drain region.

18. The method of claim 17 further comprising the step of placing a third voltage between the source region and the channel region such that the channel region is at a different voltage relative to the source region.

19. The method of claim 17 wherein the semiconductor device further comprises a Schottky contact to the channel region and an ohmic contact to the source region and the method includes the step of placing a same potential on the Schottky contact and the ohmic contact.

20. The method of claim 17 wherein the first voltage is about 1 volt to 10 volts and the second voltage is about 0.5 volts to 5 volts.

21. A method of sensing light using a compound semiconductor device that is formed in a well region and has a source region and a drain region, the method comprising the step of:

decreasing a current flow between the source region and the drain region when a photon is absorbed.

* * * * *